Oct. 3, 1967 P. F. SCHMIDT 3,345,274

METHOD OF MAKING OXIDE FILM PATTERNS

Filed April 22, 1964

INVENTOR.
PAUL F. SCHMIDT
BY
C. L. Menzemer
ATTORNEY.

United States Patent Office 3,345,274
Patented Oct. 3, 1967

3,345,274
METHOD OF MAKING OXIDE FILM PATTERNS
Paul F. Schmidt, Pittsburgh, Pa., assignor to Westinghouse Electric Corporation, East Pittsburgh, Pa., a corporation of Pennsylvania
Filed Apr. 22, 1964, Ser. No. 361,750
1 Claim. (Cl. 204—15)

ABSTRACT OF THE DISCLOSURE

This invention relates to a method of forming an anodic oxide film on a predetermined portion of at least one surface of a semiconductor wafer.

The wafer of semiconductor material is disposed in an oxygen containing electrolyte. A direct current is passed between the electrolyte and the wafer while only that portion of the wafer upon which the film is to be formed is illuminated.

This invention relates to the art of semiconductors and in particular concerns novel methods of producing controlled areas in semiconductive bodies.

The present technique of producing a controlled geometric pattern on a substrate of semiconductive material by diffusion involves the thermal oxidation of the semiconductor to produce a protective oxide layer. Thereupon areas of the oxide are masked with an acid resistant material, such as photoresist, and the unprotected areas are then removed. For silicon oxides this generally involves etching with hydrofluoric acid. When etching has been accomplished, the resist is removed and diffusion is carried out by heating the device in an atmosphere of a suitable diffusant. The resolution of desired areas in a semiconductive substrate obtainable by that method is largely limited to the accuracy of the wax or photoresist masking achieved, as well as by the tendency of the hydrofluoric acid or other etchant to undercut the mask.

It is therefore a primary object of the present invention to provide a new method by which oxide layers or films of improved resolution can be provided on the surfaces of a semiconductor.

Another object of the present invention is to provide a novel electrochemical method in which oxide masks are provided on the surface of a semiconductor with an accuracy characteristic of that achievable with a pattern of light.

A further object of the invention is to provide a method to produce highly resolved oxide areas on a surface of n-type and intrinsic semiconductive silicon in accordance with the foregoing objects.

Still another object is to provide a method for producing oxide areas on opposed major surfaces of n-type silicon.

A further object is to provide a process of encapsulation of doped anodic oxide layers in non-doped oxide on surfaces of; for example, n-type semiconductive silicon.

Other objects will be apparent from time to time in the following description and discussion of the invention taken in conjunction with the attached drawing in which.

Figure 1:
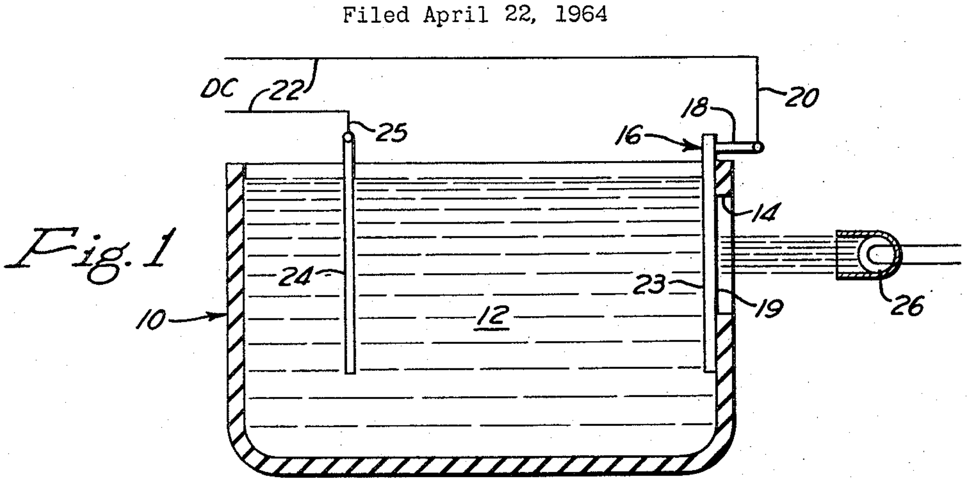
FIG. 1 shows schematically one type of electrochemical apparatus with which the invention can be practiced.

The objects and advantages of the present invention are achieved by illuminating a selected area of a surface of a semiconductor while the semiconductor is subjected to a bias and has an electrolyte in contact with the surface zone to be oxidized. In this general manner, a preselected portion of the surface of the semiconductor can be oxidized with a resolution essentially that of the resolution of light employed. Moreover, this highly desirable result is achieved in far simpler fashion than has been possible heretofore.

In a first embodiment of the invention, a portion of a surface of a semiconductor is oxidized by a process involving covering at least one surface thereof with an electrolyte. Ohmic contact is made with a first electrode, to a surface of the semiconductor where oxidation is not to occur, and a second electrode is located in the electrolyte near the surface to be oxidized, with the electrodes being supplied by a DC power source. Light is then projected to the area to be oxidized. The semiconductor used is nearly intrinsic or of n-type semiconductivity, and since anodic oxide growth can occur only in the presence of holes, oxide formation will occur exclusively on the preselected areas that are illuminated because illumination injects holes.

In a second but related embodiment, the semiconductor is made the dividing member between two electrochemical compartments, being exposed to electrolyte in each. Upon applying a bias across the two compartments and illuminating a surface of the semiconductor, anodic oxide formation occurs on one surface while hydrogen or a metal, depending on the electrolyte, is plated to the other surface. In a variation of this embodiment, after anodization of one surface has been carried out, the polarity of the electrodes can be reversed and with light projecting on the other or second surface, anodization is effected thereby resulting in oxide on both surfaces of the wafer being treated.

In still another embodiment, the semiconductor is arranged as a wall, or part thereof, of an electrochemical cell. In that arrangement, the rear surface can be illuminated easily and anodic oxide formation will occur on the other surface that is exposed to the electrolyte. A similar embodiment may use a webbed dendrite such as is disclosed in the copending application of Dermatis and Faust, Jr., Ser. No. 98,618, filed Mar. 27, 1961, and now Patent No. 3,129,061, and assigned to the assignee of the present application. By rear surface is meant the major surface opposing that on which oxide formation is to occur. For rear surface illumination, the semiconductor should be less than about six mils in thickness.

Further embodiments of the invention involve methods of keeping the electrolyte layer minimal for front surface illumination to avoid undue distortion of a light pattern. By the term light pattern is meant merely controlled illumination, and it may involve a spot, a grid, one or more lines or the like. Still other embodiments involving light projection and the like will be evident hereinafter.

As noted, in all embodiments of the invention visible or near infra-red light is projected to the semiconductor substrate and functions to provide minority carriers so that anodic oxide formation can take place. Therefore, the light should be restricted to the areas to be oxidized. However, since scattering of light passing through a liquid is quite pronounced, it is desirable to keep the path of the light while within the liquid as small as possible. Otherwise the light projected would have diffuse edges and the advantage of sharp resolution by light could be lost. A liquid film in accordance with the invention can be kept thin, thereby minimizing light scattering, by locating the surface of the semiconductive material to be oxidized at a very small distance below the surface of the liquid electrolyte. Another method of achieving this result involves spreading a film of liquid through a slot-like narrow opening and permitting the liquid to flow down the surface of semiconductive surface under the pull of gravity. The maintenance of a thin liquid film by the use of a jet or by a centrifugal force applied thereto also can be used.

If the holes generated by the light in n-type semiconductive material were permitted to move by diffusion, a diffuse anodic reaction may occur under bias applied to the semiconductor and an auxiliary electrode in the solution. This problem is overcome in accordance with the present invention by the use of blue light with a high absorption coefficient (approximately $10^5$/cm.), in the semiconductor being processed. For front surface illumination blue light is used and near infra-red is used for rear surface illumination. White light could be used for the rear but would not contribute proportionately. Consequently, carriers generated occur within or very close to the surface of the sample, for example within a few hundred angstroms, and will drift perpendicularly toward the surface in n-type silicon while bias is applied thereto. In this manner it is possible to produce sharply defined oxide patterns by an electrochemical technique.

A light source is employed in practicing the invention that is controllable in the sense that its light beams can be directed to locallized places when desired. The light pattern can, if desired, be focused on the semiconductor through an inverted microscope if it is a silicon web where rear surface illumination is practiced. Any other manner of control desired can be used as well. While various light sources can be employed for illumination, blue light (about 4500° A.) has been found to be the most satisfactory for front surface illumination since it is completely absorbed in silicon within the first few microns from its surface. White light is quite satisfactory for rear surface illumination, but other light, such as red light or near infra-red, is preferred. Since ambient illumination would interfere with the process, the entire unit can be enclosed in a container that is opaque.

Current flows in this anodization process upon the application of the light to the silicon surface, with a potential applied thereto. Thus the anodic current density (instantaneous) is a function of light intensity for different constant voltages. Oxide formation is usually carried out at current densities of about 5 to 10 milliamps per square centimeter, but higher or lower values could as well be used. In general, a light intensity of at least 4 photons per silicon atom in the surface of the silicon semiconductor is used for anodization. In practice, up to about 20 times that amount of light may be employed. Standard light sources, such as sodium or mercury lamps, white lamps or the like, alone or with filters, and with means to provide desired patterns can be used. It will be appreciated that each light source may have to be standardized for any given practice to account for possible current variations in any source used to power the light and to take into consideration light absorption at any place in the electro-chemical system employed.

A wide variety of electrolytes can be used in practicing the present invention. For example, mineral acids such, for example, as meta-, ortho- or pyrophosphoric acid, alone or in admixture with other acids, or in solution in organic solvents such as tetrahydrofurfuryl alcohol or N,N-dimethylpropionamide can be employed. Solutions of inorganic salts, for example, ammonium persulfate, sodium nitrite or other salt, in the aforementioned organic solvents can be used as well, with dilute solutions thereof being particularly suited to high voltage operations. As a generalization, any conventional electrolyte can be used, for it will provide ions for current conditions. Of course it must also provide oxygen for oxide formation to occur. Moreover, as will be apparent to the artisan, it should be essentially inert with respect to chemical attack on the semiconductor, or oxide resulting, at the conditions of operation. The conditions of operation and the results to be achieved are taken into consideration in the choice of an electrolyte for any particular practice. For example, it has been found that oxide films of about 5 angstroms in thickness result per volt of forming voltage. Moreover, the maximum forming voltage for each electrolyte may differ from one another by hundreds of volts. Accordingly for the development of oxide films that are quite thick, e.g. 1500 to 4000 angstroms, it is apparent that an electrolyte employed must permit the use of high forming voltages. In addition, it is desirable that the electrolyte, in operation, be free from bubble formation because bubbles can result in a porous oxide film. Of course, this is a question of perfection rather than one of operability.

The present invention is applicable only with nearly intrinsic or n-type semiconductive materials. Suitably these materials have a reasonably wide forbidden gap, for example on the order of 1.0 electron volt. Silicon is the preferred semiconductive material that is to be used but other semiconductor materials can also be employed. It is further essential to practice of the invention that the semiconductive material to be anodized have a resistivity of at least one ohm-cm. or higher, for example, 10 to 100 ohm-cm. or more. Material of any thickness can be used, but generally is on the order of 2 to 15 mils or more, except for rear surface illumination when the thickness must be about 6 mils or less in thickness.

The invention will be described further in conjunction with the attached drawing.

Referring to FIG. 1 of the drawing, there is shown a container 10 suitable for holding a quantity of electrolyte 12 needed to practice the invention. The container 10 can be made of any material desired, for example glass, plastic, ceramic or other electrically non-conducting material. A hole 14 is cut in the side wall of container 10. A wafer or slice 16 of, for example, n-type silicon upon which anodic oxidation is to occur, is located within the container 10 over the hole 14. A first electrode 18 is attached in ohmic contact to one end of the slice 16 of silicon on its rear surface 19; the electrode 18 has a lead 20 to one side of a DC power source 22. A second electrode 24 is located in the electrolyte within the container 10 near the surface 23 of the semiconductor slice 16; it, too, has a lead 25 to the power source 22 and is the negative electrode in operation. A light source 26 is focused on the rear surface 19 of the slice 16 of silicon through the hole 14. For this embodiment, that is in which illumination of the rear surface is practiced, the slice of silicon must be about 6 mils or less. The entire system is enclosed in an opaque zone (not shown) to avoid effects from ambient light.

In operation to provide an anodic film on the slice of silicon at its surface 23, bias is applied across the electrodes 18 and 24 of up to about 300 volts as desired. Then light from source 26 is projected to the rear surface 19 of the silicon, thereby injecting minority carriers which, in effect, complete the circuit through the silicon whereupon anodization occurs.

In a related embodiment, the wafer of n-type silicon is made the dividing member of a two compartment electrochemical cell, and thus the compartments can make "contact" only through the silicon. In this embodiment, no direct electrode contact is made to the silicon, but instead an electrode (e.g. platinum) is placed in each cell. A light source can be located so as to shine through transparent walls into each compartment, and arranged to operate upon demand; that is, only one will be operated at a time and that will be for illumination on the surface to be anodized. With, for example, 15 volume percent pyrophosphoric acid in tetrahydrofurfuryl alcohol in one cell and concentrated nitric acid in the second cell, the following advantageous operation can be carried out. With light focused on the surface in contact with the pyrophosphoric acid and the electrode therein being the negative electrode, a phosphorus doped oxide results. Thereupon the light in that compartment is turned off, and the other light is activated. With this condition, the polarity of the electrodes is reversed and anodization producing an undoped silicon dioxide film is produced on the second side. It has been found experimentally that no loss of phosphorus occurs under the cathodization in the first compartment while anodization is occurring in the second one. Moreover, the oxide films on the surfaces are independent of one another and accordingly any desired thickness can be obtained on each side.

Of course other electrolytes can be used for the process just indicated, it being only necessary that the electrolyte be capable of supplying oxygen for anodization and that hydrogen "plate" out on the reverse surface, or in other words, no metal is plated out which might inject carriers and which could interfere with the second anodization to be effected. Of course, the geometry control characteristic of the invention is had with both anodizations in this process.

It is thus apparent that doped geometry controlled oxide areas can be provided by the invention. A doped oxide is particularly useful as a diffusion source. However, during heating, some of the source may "out-diffuse" and thereby be wasted, in a sense. In accordance with still another discovery, this is avoided and essentially all the doping impurity remains available for diffusion. For this purpose, after a doped oxide is developed as by anodization in pyrophosphoric acid in tetrahydrofurfuryl alcohol, the anodized surface is subjected to anodization, under illumination, in an electrolyte that produces an oxide free from doping impurities. A typical electrolyte is 1 to 10 weight percent of sodium nitrite or ammonium nitrite in tetrahydrofurfuryl alcohol, but other electrolytes can as well be used. This second anodization can, if desired, be carried out over the entire surface, thereby encapsulating the doped oxide so that effective use of the doping impurity results upon later diffusion, and simultaneously providing a protective oxide on the remainder of the surface to protect it from unintentional doping. The protective doping can also be a deposition of non-doped pyrolytic oxide ($SiO_2$).

Figure 2:
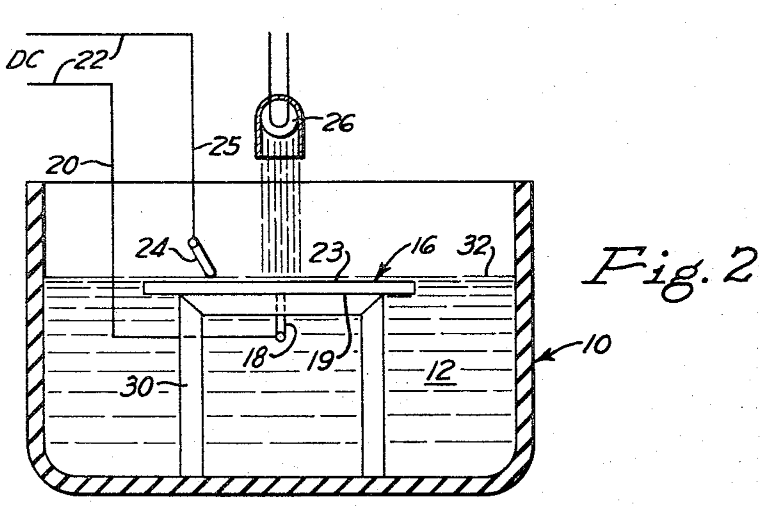
FIG. 2 shows another schematic representation of electrochemical apparatus by which the invention can be practiced.

Another arrangement for practicing the invention is shown in FIG. 2, to which reference now will be made. Elements similar to those described in conjunction with FIG. 1 are given the same number. Thus, a container 10 holding a quantity of electrolyte 12 is provided. Within the container is a slice 16 of n-type silicon supported by a non-conducting means 30 that may, if desired, be made of material similar to that employed for container 10. The size of support 30 and the quantity of electrolyte 12 employed are interrelated to the extent that the upper or anodization surface 23 of the silicon is just under the upper surface 32 of the body of electrolyte 12. As already noted, light distortion is a problem that is to be minimized, and the thinner the body of electrolyte above the upper surface 23 of the silicon, the less will be the distortion. A first electrode 18 is in ohmic contact with the rear surface 19 of the slice 16 of silicon and a second electrode 24 is immersed in the electrolyte 12 at the side of the slice 16 of silicon. To provide ohmic contact in this and other embodiments, a low work function metal such as aluminum or zinc is evaporated to the silicon, and then a lead is soldered to the metal deposit. The electrodes are connected by leads 20 and 25 to the DC power source 22 with the electrode near the surface to be anodized being the negative electrode. Finally the controllable light source 26 is provided above the upper surface 32 of the electrolyte 12, and illuminates the areas on surface 23 of the silicon where anodization is to occur. Operation is, for practical purposes, as discussed with respect to FIG. 1, except for light projection through the electrolyte.

Figure 3:
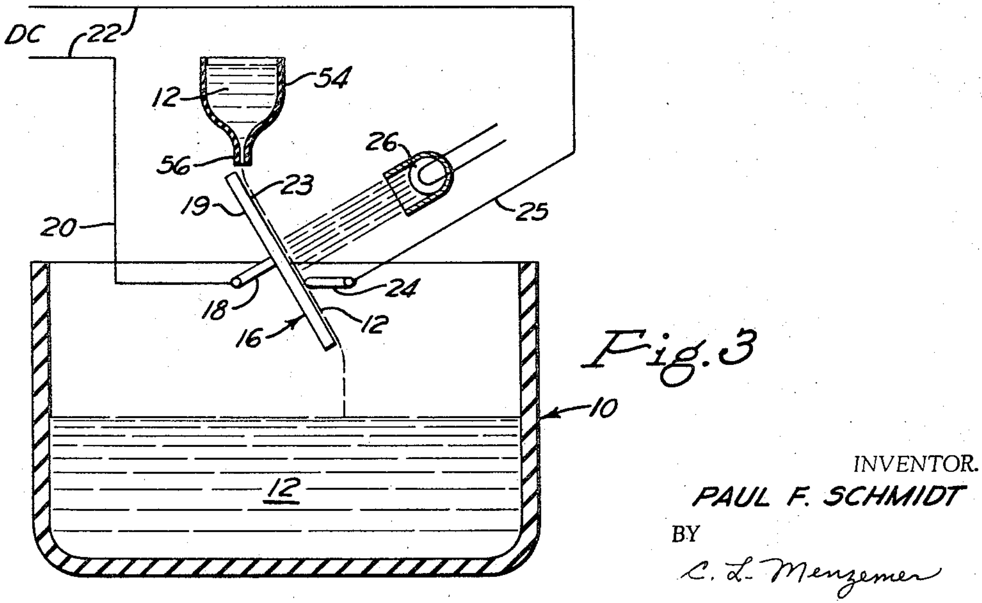
FIG. 3 is a third schematic representation of electrochemical apparatus showing another disposition of a semiconductor for purposes of the invention.

A third embodiment is shown in FIG. 3. In this embodiment a slice 16 of the n-type silicon is supported, in any manner desired, above the container 10 adapted to receive electrolyte 12. Above the slice 16 of silicon is a container 54 of electrolyte 12, the container having a slot-like opening 56 at its lower end, which is positioned to permit a film of electrolyte to flow therefrom and over the surface 23 of the slice 16 of silicon. Electrodes 18 and 24 are located similarly to those in FIG. 2 and are powered by DC source 22. A light source 26 is located to project light to the areas desired, through the film of electrolyte on the surface 23. It will be appreciated that in this particular embodiment, minimal electrolyte thickness is provided and consequently, the electrolyte has very little effect on scattering of light.

In the following specific example of the invention the details are given by way of illustration and not by way of limitation.

*Example I*

A wafer of n-type silicon having dimensions of 1 x 2 cm. and being 10 mils thick is used. It has a resistivity of 11 ohm-cm. and its surfaces are cleaned as by immersion for about one minute in a mixture of 9 parts of nitric acid and 1 part hydrofluoric acid. An electrode is attached, as by soldering to an aluminum deposit on its surface, and is connected to a direct current power source. A platinum electrode having a lead to the power source is placed in an electrolyte in a non-conducting container. Aqueous phosphoric acid is the electrolyte. The wafer of silicon is placed just under the surface of the electrolyte, with the surface having the electrode attached being remote from the electrolyte surface. A light beam is then spot focused on a part of the surface of the silicon. With the applied voltage at 80 volts, an oxide film grows on the n-type silicon to a thickness of 400 angstroms.

Numerous tests of the invention have been made in the manner as set forth in the example just described as well as in the manner described in conjunction with the drawing. These have regularly resulted in oxide formation at a resolution of as low as 15 microns, and even finer resolution can be achieved. The resulting anodized silicon was then tested and found to be an effective mask against the diffusion of boron or phosphorus into the silicon. In other tests, pyrophosphoric acid in tetrahydrofurfuryl alcohol was used as the electrolyte, and good films at high resolution and containing phosphorus as a doping impurity were produced. Still further, n-type silicon wafers containing doped areas produced, for example, by anodization in the pyrophosphoric acid solutions, have been further anodized in ammonium nitrate solutions resulting in a silicon dioxide coating over the doped area as well as the remainder of wafer surface. Thereafter, these wafers have been subjected to diffusion conditions and it was found that the encapsulating oxide coating effectively prevented any material loss of the phosphorus from the doped oxide to the atmosphere.

From the foregoing discussion and description it is evident that the present invention comprises a unique method by which selected oxide areas can be provided on n-type or intrinsic semiconductive material, such as n-type silicon, at a high resolution and in a far simpler fashion than is characteristic of present techniques available. While the invention has been described with respect to specific materials, it will be apparent that changes can be made without departing from its scope. For example, in addition to the electrolytes specified, other useful electrolytes include alkali borates, concentrated aqueous boric acid, solutions of boric acid in glycerine, in aluminate and gallate solutions. Further, a particularly satisfactory electrolyte is potassium, sodium or ammonium nitrite in tetrahydrofurfuryl alcohol or N.N-dimethylpropionamide. The anodization process can be carried out at temperatures of up to, for example, about 100° C. depending, of course, on the particular electrolyte being used. In addition to the use of ordinary light or blue light, collimated light can be used especially where longer wavelengths are desired and line resolution is to be achieved. Moreover white light or red light can be used as well. Other changes will occur to those skilled in the art.

I claim:

A method comprising contacting a first surface of an n-type semiconductive member with a first electrolyte that can supply oxygen for anodization of said member, contacting an opposed surface of the semiconductive member with a second electrolyte that can supply oxygen for anodization of said member, said member forming a dividing member of a two compartment electrochemical cell in which the compartments can make contact only through said member, applying a direct current power source across the two electrolytes in a zone free from uncontrolled illumination, then projecting light to the surface of said semiconductive member in contact with electrolyte having the negative side of said DC power source in electrical contact therewith to anodize the surface of the semiconductive member contacting that electrolyte, thereafter reversing the polarity of the DC power source across the electrolytes and projecting light to the surface of semiconductive member now in contact with electrolyte electrically contacting the negative side of said source to anodize the second surface of the semiconductive member.

References Cited

UNITED STATES PATENTS

| | | | |
|---|---|---|---|
| 2,909,470 | 10/1959 | Schmidt | 204—14 |
| 3,261,773 | 7/1966 | Sandmann et al. | 204—32 |

FOREIGN PATENTS

| | | |
|---|---|---|
| 608,557 | 9/1948 | Great Britain. |

JOHN H. MACK, *Primary Examiner.*

T. TUFARIELLO, *Assistant Examiner.*